US012564042B2

(12) United States Patent
Xu et al.

(10) Patent No.: US 12,564,042 B2
(45) Date of Patent: Feb. 24, 2026

(54) SEMICONDUCTOR STRUCTURE AND LAYOUT STRUCTURE

(71) Applicant: CHANGXIN MEMORY TECHNOLOGIES, INC., Hefei City (CN)

(72) Inventors: Jing Xu, Hefei City (CN); Kangling Ji, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 383 days.

(21) Appl. No.: 18/450,798

(22) Filed: Aug. 16, 2023

(65) Prior Publication Data

US 2024/0105618 A1 Mar. 28, 2024

Related U.S. Application Data

(63) Continuation of application No. PCT/CN2022/125615, filed on Oct. 17, 2022.

(30) Foreign Application Priority Data

Sep. 22, 2022 (CN) .......................... 202211160024.4

(51) Int. Cl.
*H01L 23/528* (2006.01)
*H01L 23/50* (2006.01)
(Continued)

(52) U.S. Cl.
CPC .......... *H01L 23/5286* (2013.01); *H01L 23/50* (2013.01); *H01L 23/5226* (2013.01); *H10B 12/50* (2023.02)

(58) Field of Classification Search
CPC . H01L 23/5286; H01L 23/50; H01L 23/5226; H10B 12/50
(Continued)

(56) References Cited

U.S. PATENT DOCUMENTS 7,545,037 B2 6/2009 Lee
8,115,315 B2 2/2012 Lee
(Continued)

FOREIGN PATENT DOCUMENTS

CN 103000593 A 3/2013
CN 110858572 A 3/2020
(Continued)

OTHER PUBLICATIONS

International Search Report in the international application No. PCT/CN2022/125615, mailed on Apr. 20, 2023. 6 pages with English translation.

*Primary Examiner* — Tu-Tu V Ho
(74) *Attorney, Agent, or Firm* — Syncoda LLC; Feng Ma

(57) ABSTRACT

A semiconductor structure includes: a high-speed circuit module including a clock signal with a frequency greater than a first threshold; a first conductive metal layer including power conductive wires extending along a first direction and arranged at intervals, and the power conductive wires being electrically connected with the high-speed circuit module; and a redistribution layer located above the first conductive metal layer and including power pads and electrical wires connected with the power pads, in which the power pads are located at one side of the high-speed circuit module, a projection of the power pads does not overlap with that of the high-speed circuit module, the electrical wires include a first electrical wire region where the electrical wires are repeatedly bent, the first electrical wire region at least partially covers the high-speed circuit module, and the electrical wires are used for electrically connecting the power conductive wires and power pads.

16 Claims, 8 Drawing Sheets

(51) Int. Cl.
*H01L 23/522* (2006.01)
*H10B 12/00* (2023.01)

(58) Field of Classification Search
USPC ......................................................... 257/774
See application file for complete search history.

(56) References Cited

U.S. PATENT DOCUMENTS

| | | | | |
|---|---|---|---|---|
| 8,334,599 | B2 * | 12/2012 | Bruennert | ............. H01L 23/481 |
| | | | | 257/E23.174 |
| 8,410,611 | B2 | 4/2013 | Lee | |
| 8,643,178 | B2 | 2/2014 | Lee | |
| 10,734,359 | B2 | 8/2020 | Tobori | |
| 2006/0220215 | A1 | 10/2006 | Lee | |
| 2009/0212414 | A1 | 8/2009 | Lee | |
| 2012/0104627 | A1 | 5/2012 | Lee | |
| 2013/0161830 | A1 | 6/2013 | Lee | |
| 2020/0066681 | A1 | 2/2020 | Tobori | |
| 2021/0287965 | A1 | 9/2021 | Lee | |
| 2022/0068853 | A1 | 3/2022 | Lee | |
| 2022/0068854 | A1 | 3/2022 | Lin | |

FOREIGN PATENT DOCUMENTS

| | | |
|---|---|---|
| CN | 114121082 A | 3/2022 |
| CN | 114121883 A | 3/2022 |

* cited by examiner

SEMICONDUCTOR STRUCTURE AND LAYOUT STRUCTURE

CROSS-REFERENCE TO RELATED APPLICATIONS

This is a continuation of International Patent Application No. PCT/CN2022/125615 filed on Oct. 17, 2022, which claims priority to Chinese Patent Application No. 202211160024.4 filed on Sep. 22, 2022. The disclosures of the above-referenced applications are hereby incorporated by reference in their entirety.

BACKGROUND

Low power double data rate synchronous dynamic random access memory (LPDDR) is a kind of dynamic random access memory with low power and high speed. In order to meet the requirements of high speed and low power, the design of powers and related circuits is very important.

In some implementations, under fixed positions of power pads, it is difficult to design a high-speed circuit of LPDDR where a power signal is assessed by a redistribution layer (RDL) while supplying power to other modules of the memory, such as memory cell arrays.

SUMMARY

In view of this, embodiments of the disclosure provide a semiconductor structure and a layout structure.

In the first aspect, the embodiments of the disclosure provide a semiconductor structure, including a high-speed circuit module, a first conductive metal layer, and a redistribution layer.

The high-speed circuit module includes a clock signal with a frequency greater than a first threshold.

The first conductive metal layer includes a plurality of power conductive wires extending along a first direction and arranged at intervals, and the plurality of power conductive wires are electrically connected with the high-speed circuit module.

The redistribution layer is located above the first conductive metal layer and includes a plurality of power pads and electrical wires connected with the power pads. The power pads are located at one side of the high-speed circuit module. A projection of the power pads does not overlap with a projection of the high-speed circuit module. The electrical wires include a first electrical wire region where the electrical wires are repeatedly bent. The first electrical wire region at least partially covers the high-speed circuit module. The electrical wires are used for electrically connecting the power conductive wires and the power pads.

In the second aspect, the embodiments of the disclosure further provides a layout structure including a high-speed circuit module layout, a first conductive metal layer layout, and a redistribution layer layout.

The high-speed circuit module layout is at least used for forming a clock signal having a frequency greater than a first threshold.

The first conductive metal layer layout includes a plurality of power conductive wire patterns extending along a first direction. The plurality of power conductive wire patterns are used for forming a plurality of power conductive wires to electrically connect with a high-speed circuit module.

The redistribution layer layout is located above the first conductive metal layer layout and includes a plurality of power pad patterns and electrical wire patterns connected with the power pad patterns. The power pad patterns are located at one side of the high-speed circuit module layout. A projection of the power pad patterns does not overlap with a projection of the high-speed circuit module layout. The electrical wire patterns include a first electrical wire region where the electrical wire patterns are repeatedly bent. The first electrical wire region at least partially covers the high-speed circuit module layout. The electrical wire patterns electrically connect the power conductive wire patterns and the power pad patterns.

DETAILED DESCRIPTION

Figure 1:
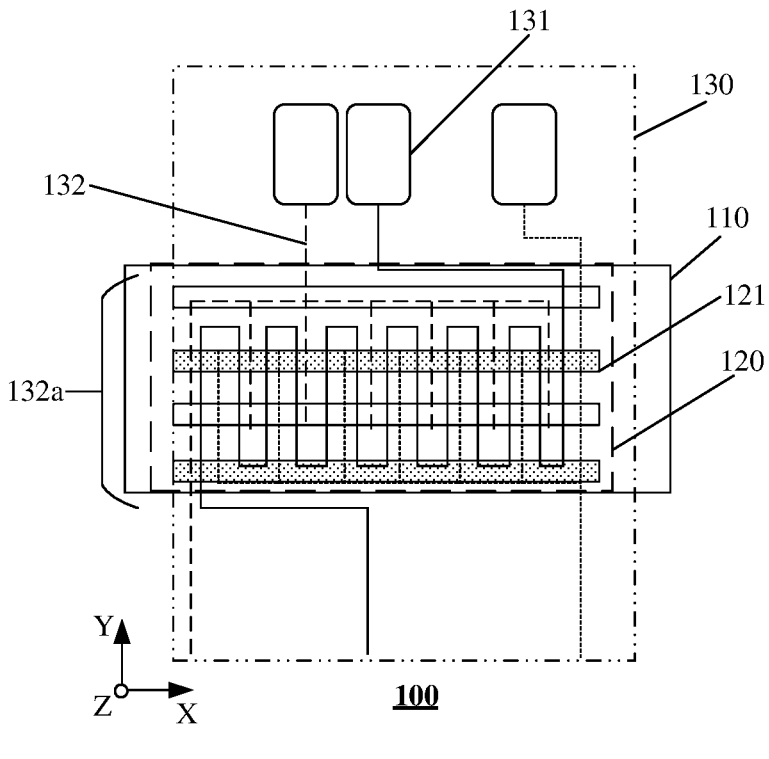
FIG. 1 is a schematic diagram of a semiconductor structure provided by an embodiment of the disclosure.

Embodiments of the disclosure relate to the technical field of semiconductors, and relate to but are not limited to a semiconductor structure and a layout structure.

In order to facilitate understanding of the disclosure, exemplary embodiments of the disclosure will be described in more detail below with reference to the related accompanying drawings. Although exemplary embodiments of the present disclosure are shown in the drawings, it should be understood that the present disclosure may be implemented in various forms and should not be limited to the specific embodiments set forth herein. On the contrary, these embodiments are provided to enable a more thorough understanding of the disclosure and to fully convey the scope of the disclosure to those skilled in the art.

In the following description, numerous specific details are given to provide a more thorough understanding of the disclosure. However, it will be apparent to those skilled in the art that the disclosure may be practiced without one or more of these details. In some embodiments, some technical features well known in the art are not described in order to avoid confusion with the disclosure. That is, all features of the actual embodiments may not be described herein and well-known functions and structures are not described in detail.

Terms can be understood, at least in part, from their use in context. For example, depending at least in part on the context, the term "one or more" as used herein may be used to describe any feature, structure, or characteristic in a singular sense, or may be used to describe a combination of features, structures, or characteristics in a plural sense. Similarly, terms such as "a" or "said" may likewise be understood as conveying singular usage or conveying plural usage, depending at least in part on the context. Additionally, belonging to "based on" may be understood as not necessarily intended to convey an exclusive set of factors, and may alternatively allow an existence of additional factors that are not necessarily explicitly described, also depending at least in part on context.

The terminology used herein is intended to describe specific embodiments only and is not to be a limitation of the disclosure unless otherwise defined. As used herein, the singular forms of "a", "an" and "said/the" are also intended to include the plural forms, unless the context clearly indicates otherwise. It should also be understood that the terms "compose" and/or "include", when used in this specification, determine the presence of said features, integers, steps, operations, elements and/or components, but do not exclude the presence or addition of one or more other features, integers, steps, operations, elements, components and/or groups. When used herein, the term "and/or" includes any of the listed items and all combinations thereof.

In order to fully understand the disclosure, detailed operations and detailed structures are presented in the following description in order to explain the technical solutions of the disclosure. Preferred embodiments of the disclosure are described in detail below. However, the disclosure may have other embodiments except these detailed descriptions.

As shown in FIG. 1, an embodiment of the disclosure provides a semiconductor structure 100, including a high-speed circuit module 110, a first conductive metal layer 120 and a redistribution layer 130.

The high-speed circuit module 110 includes a clock signal with a frequency greater than a first threshold.

The first conductive metal layer includes a plurality of power conductive wires 121 extending along a first direction and arranged at intervals. The power conductive wires are electrically connected with the high-speed circuit module 110.

The redistribution layer is located above the first conductive metal layer 120. The redistribution layer 130 includes a plurality of power pads 131, and electrical wires 132 connected with the power pads 131. The power pads 131 are located at one side of the high-speed circuit module 110. A projection of the power pads 131 does not overlap with that of the high-speed circuit module 110. The electrical wires 132 include a first electrical wire region 132a where the electrical wires are repeatedly bent. The first electrical wire region 132a at least partially covers the high-speed circuit module 110. The electrical wires 132 are used for electrically connecting the power conductive wires 121 and the power pads 131.

The semiconductor structure related to the embodiments of the disclosure can be applied to a memory. The memory includes, but is not limited to, DRAM, static random access memory (SRAM), ferroelectric random access memory (FRAM), magnetic random access memory (MRAM), phase change random access memory (PCRAM), resistive random access memory (RRAM), nano random access memory (NRAM), etc. Especially, the semiconductor structure can be applied to LPDDR memory.

Double data rate (DDR) is a common memory, while LPDDR is a memory with low power consumption. LPDDR can be applied to smart phones, smart watches, and other products sensitive to power consumption and volume.

In addition, LPDDR5 has a characteristic of high speed, and its digital logic circuit adopts a design of a high-speed circuit to improve a data processing rate. Generally, a high-speed circuit may also be called a high-frequency circuit. In a case of a high-speed circuit, calculation of a digital circuit is achieved based on high-speed jumping of clock signals. A digital logic circuit may be considered a high-speed circuit when a data transmission rate of the circuit is higher than a first threshold (e.g., 4,800 megabits per second (Mbps)). Herein the high-speed circuit module 110 generally refers to any logic circuit module with high speed in a memory to which the semiconductor structure 100 of the embodiments of the disclosure is applied.

The first conductive metal layer 120 includes at least power conductive wires 121 for providing a power signal to the high-speed circuit module 110. The power conductive wires 121 may be part of the high-speed circuit module 110. That is, the high-speed circuit module 110 may include some power conductive wires located in the first conductive metal layer 120. In addition, the high-speed circuit module 110 may also include device(s) and circuit module(s) located in other metal layer(s) or structural layer(s) of the semiconductor structure. Illustratively, the first conductive metal layer 120 may be a top metal layer M4 in a memory structure.

In an embodiment of the disclosure, the power conductive wires 121 in the first conductive metal layer 120 may include a plurality of power lines extending along the first direction. Each of the conductive wires can be used for providing power signals to different positions of the high-speed circuit module 110. Here, the first direction may be an X direction as shown in FIG. 1.

Figure 2:
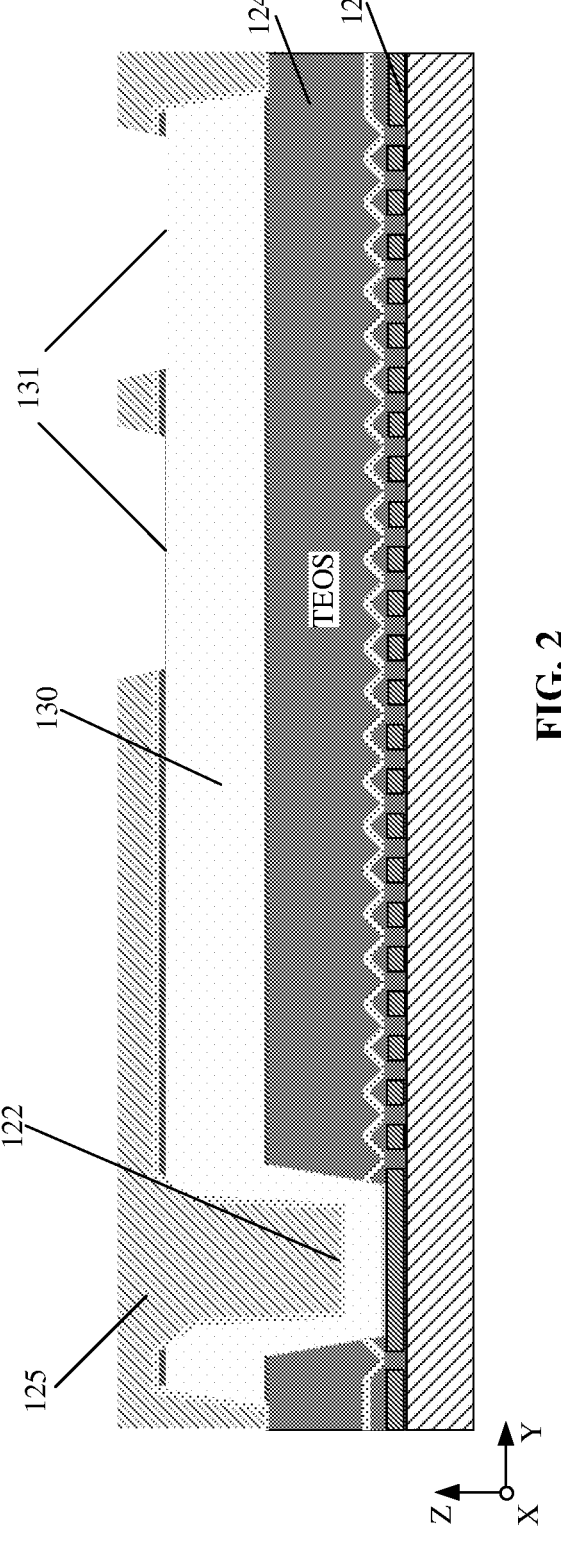
FIG. 2 is a schematic diagram of a partial cross section of a semiconductor structure provided by an embodiment of the disclosure.

In an embodiment of the disclosure, the redistribution layer 130 is located above the first conductive metal layer 120, which means that the redistribution layer 130 is another metal layer covering the first conductive metal layer 120 along a Z direction as shown in FIG. 1. As shown in FIG. 2, the first conductive metal layer 120 may be covered with an insulating material layer 124, e.g., an oxide layer or an organic compound layer such as a tetraethoxysilane (TEOS) layer as shown in the figure. The redistribution layer 130 is covered on the insulating material layer. The redistribution layer 130 may be connected with the first conductive metal layer 120 through a through via 122 penetrating the insulating material layer. The redistribution layer 130 may include a variety of signal pads, including power pads, data interface pads, grounded pads, and so on. As shown in FIG. 2, the redistribution layer 130 may be covered with another insulating material layer 125, such as a Polyimide (PI) layer, a silicon nitride layer, and a layer of other oxides or organic compound materials, etc. Positions of the various signal pads may be exposed without being covered by the insulating material, so that other signal ends can access.

Materials used for the first conductive metal layer 120 and the redistribution layer 130 may be metallic aluminum, metallic copper, or various other conductive materials such as titanium nitride (TiN), etc.

In an embodiment of the disclosure, the electrical wires 132 in the redistribution layer 130 has the first electrical wire region 132a where the electrical wires are repeatedly bending. The first electrical wire region 132a is located at one side of the power pads 131 along a Y direction as shown in FIG. 1. The electrical wires 132 extend from the power pads 131 to a position of the first electrical wire region 132a and are repeatedly bent, so that the electrical wires 132 above the power conductive wires 121 of the first conductive metal layer 120 has more overlaps with the power conductive wires 121. In this way, the first conductive metal layer 120 may be electrically connected with the redistribution layer

130 by more through vias, thereby increasing contact area between the wires of the two layers and reducing contact resistance. Since the power conductive wires 121 in the first conductive metal layer 120 can be directly used for supplying power to the high-speed circuit, the above design can effectively reduce power consumption and ensure power supply of the high-speed circuit.

Figure 3:
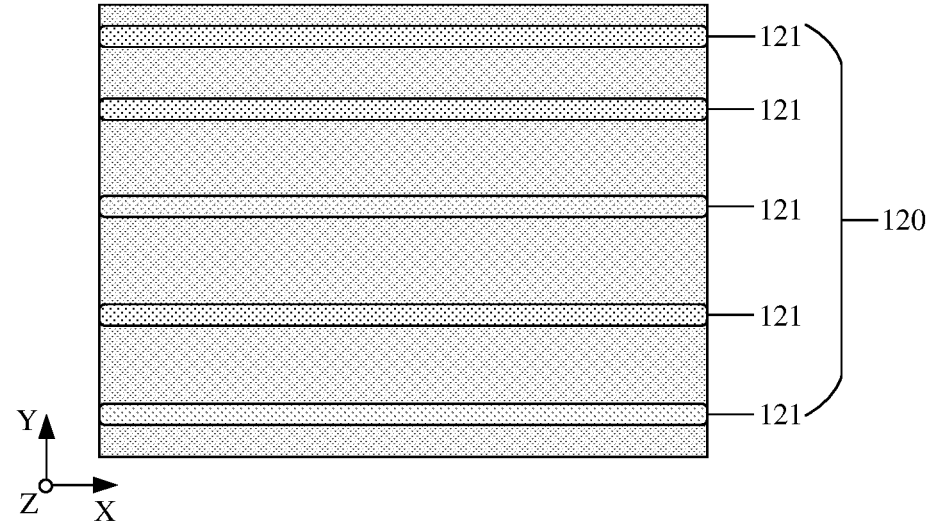
FIG. 3 is a schematic diagram of power conductive wires arranged at intervals in a semiconductor structure provided by an embodiment of the disclosure.

As shown in FIG. 3, the plurality of power conductive wires 121 may be arranged at intervals in parallel, so that more regions can be covered to provide power voltages to different nodes of the first conductive metal layer 120. In this way, the different nodes can be connected with corresponding metal wires nearby without too many jumpers.

Each of the power conductive wires 121 may be electrically connected to the electrical wires 132 via the through vias (not shown in FIG. 3). Therefore, each of the power conductive wire 121 may include a power line providing a same power signal.

In some embodiments, the plurality of power pads are used for providing different power voltages.

In these embodiments, each of the power conductive wires includes a plurality of power lines. The plurality of power lines are respectively used for connecting different power pads. Each of the power lines is electrically connected with an electrical wire of a corresponding power source through a plurality of connection vias.

Figure 4:
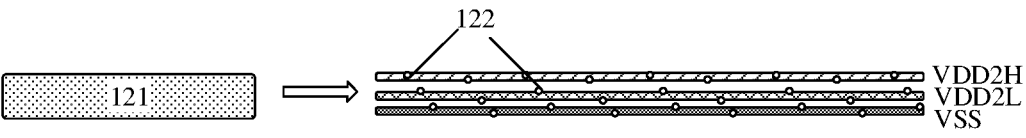
FIG. 4 is a schematic diagram of a plurality of power lines included by a power conductive wire in a semiconductor structure provided by an embodiment of the disclosure.

Each of the power conductive wires 121 may include the plurality of power lines. The plurality of power lines may also be arranged at intervals in parallel as shown in FIG. 4. The different power lines are respectively used for connecting different power sources. A through via 122 may be disposed at of a position where a projection of each of the electrical wires 132 connected with the different power pads overlap with a projection of the corresponding power line in the first electrical wire region 132*a*, so as to connect the electrical wire 132 with one power line.

Illustratively, as shown in FIG. 4, each of the power conductive wires 121 includes a first power line VDD2H, a second power line VSS, and a third power line VDD2L arranged at intervals.

It is to be noted that, FIG. 4 only shows a relationship between the three power lines arranged at intervals illustratively, and is not intended to limit the power lines to be straight lines, nor implies that the power lines must be distributed in parallel. In fact, each of the power lines may be bent. For example, several power lines are in an inserting state.

In addition, each of the power lines may have a plurality of through vias 122 for connecting with the electrical wires 132. The through vias 122 of two adjacent ones of the power lines may be distributed in a staggered way, and the adjacent through vias 122 on a same power line may also be distributed in a staggered way, thereby reducing signal interference between the various through vias and improving structural stability in a manufacturing process.

In some embodiments, the electrical wires with which the plurality of power pads of different power voltages are connected are distributed at equal intervals in the first electrical wire region.

As shown in FIG. 1, the plurality of power pads for providing different power voltages are respectively connected with the electrical wires that are repeatedly bent in the first electrical wire region. In the first electrical wire region, the electrical wires connected with the different power pads do not cross with each other, and may also be regularly and alternately bent. The different electrical wires may be distributed at equal intervals in the first electrical wire region, so that on the one hand, the electrical wires are conveniently connected with the first conductive metal layer 120, and on the other hand, crosstalk between signals may be reduced.

Figure 5:
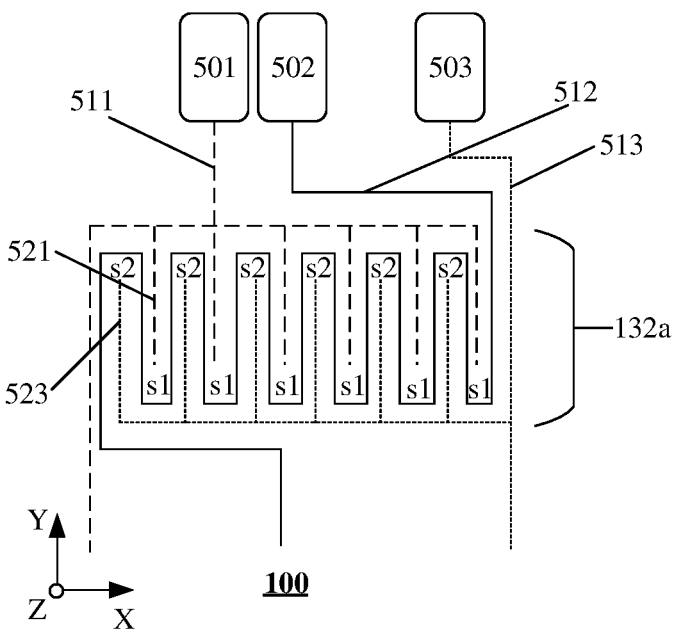
FIG. 5 is a schematic diagram of a distribution of electrical wires in a semiconductor structure provided by an embodiment of the disclosure.

In some embodiments, as shown in FIG. 5, the plurality of power pads for providing different power voltages at least include a first power pad 501, a second power pad 502, and a third power pad 503 arranged sequentially along the first direction. The first direction is an extension direction of the power conductive wires 121.

An electrical wire connected with the first power pad 501 is a first electrical wire 511.

An electrical wire connected with the second power pad 502 is a second electrical wire 512.

An electrical wire connected with the third power pad 503 is a third electrical wire 513.

The first power pad 501 may be a pad VDD2H that provides a first high power voltage, the second power pad 502 may be a pad VSS that provides a low power voltage or grounds, and the third power pad 503 may be a pad VDD2L that provides a second high power voltage. VDD2H and VDD2L may be used for providing different power signals to the high-speed circuit module through the first conductive metal layer 120 in order to implement more flexible and complex circuit functions. The above design is only an illustrative embodiment. In practical application, the above power pads may also include other pads that provide different power voltages, depending on the functions and requirements of the high-speed circuit module.

In addition, the number of each the first power pad 501, the second power pad 502, and the third power pad 503 may be one or more. That is, the number of each type of the power pads may not be limited to one, thereby facilitating the design of the circuit and the routing of the wires.

In some embodiments, first concave areas s1 and second concave areas s2 arranged alternately and extending along the first direction are formed by bending the second electrical wire 512 in the first electrical wire region 132*a*.

An orientation of notches of the first concave areas s1 is opposite to an orientation of notches of the second concave areas s2.

The first electrical wire 511 includes a plurality of first branches 521 along the first direction. Each of the first branches 521 extends into a corresponding one of the first concave areas s1. The third electrical wire 513 includes a plurality of second branches 523 along the first direction. Each of the second branches 523 extends into a corresponding one of the second concave areas s2.

As shown in FIG. 5, the second power pad 502 is located between the first power pad 501 and the third power pad 503. The first electrical wire 511 connected with the first power pad 501, the second electrical wire 512 connected with the second power pad 502 and the third electrical wire 513 connected with the third power pad 503 each extend from the corresponding power pad to the first electrical wire region 132*a* and are bent, so that the three electrical wires are distributed as equally spaced as possible. The second electrical wire 512 located in a middle of the three electrical wires may adopt a serpentine structure and extend along the first direction (the X direction). The second electrical wire 512 that is bent forms a plurality of concave areas on both sides along a second direction. The first electrical wire 511 and the third electrical wire 513 each may be provided with a plurality of branches in a pectinate shape and extend into openings. The first branches 521 of the first electrical wire 511 may extend into the first concave areas s1, and the second branches 523 of the third electrical wire 513 may extend into the second concave areas s2. A direction in which the first branches extend is opposite to a direction in which the second branches extend.

In this way, on the one hand, the contact area between each of the three electrical wires and the first conductive metal layer 120 can be increased by bending, and on the other hand, voltage balance of the three power sources at various positions can be maintained to improve stability of the circuit.

Figure 6:
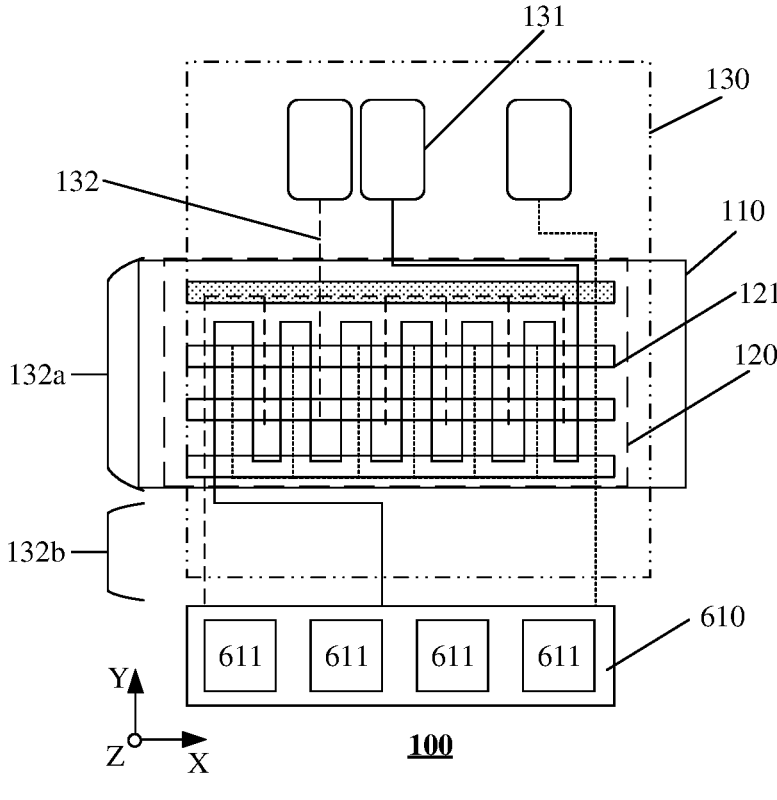
FIG. 6 is a schematic diagram of a semiconductor structure including memory cell arrays provided by an embodiment of the disclosure.

In some embodiments, as shown in FIG. 6, the semiconductor structure 100 further includes a memory cell array region 610.

The memory cell array region is located at one side of the high-speed circuit module 110 away from the power pads 131. The memory cell array region 610 includes a plurality of memory cell arrays 611. The power pads 131 are connected with the memory cell arrays 611 through the electrical wires 132 of the redistribution layer 130.

The power pads 131 are used for supplying power to the high-speed circuit module 110 by connecting the first conductive metal layer 120, and also may be used for supplying power signals to the memory cell arrays 611.

The electrical wires 132 connected with the power pads 131 may extend to the memory cell array region 610 and connect the memory cell arrays.

In some embodiments, the electrical wires 132 of the redistribution layer 130 further includes a second electrical wire region 132b for connecting the memory cell arrays 611. A projection of the electrical wires 132 in the second electrical wire region 132b does not overlap a projection of the high-speed circuit module 110. The electrical wires 132 passing through the first electrical wire region 132a and the second electrical wire region 132b connect the power pads and the memory cell arrays.

After each of the above electrical wires 132 extends to the first electrical wire region 132a and is repeatedly bent, at least one end of the electrical wire 132 may continue to extend to the memory cell array region 610. The electrical wires in the second electrical wire region 132b may be straight, or there may be some bends for the electrical wires to be connected with desired positions of the memory cell arrays 611.

Figure 7:
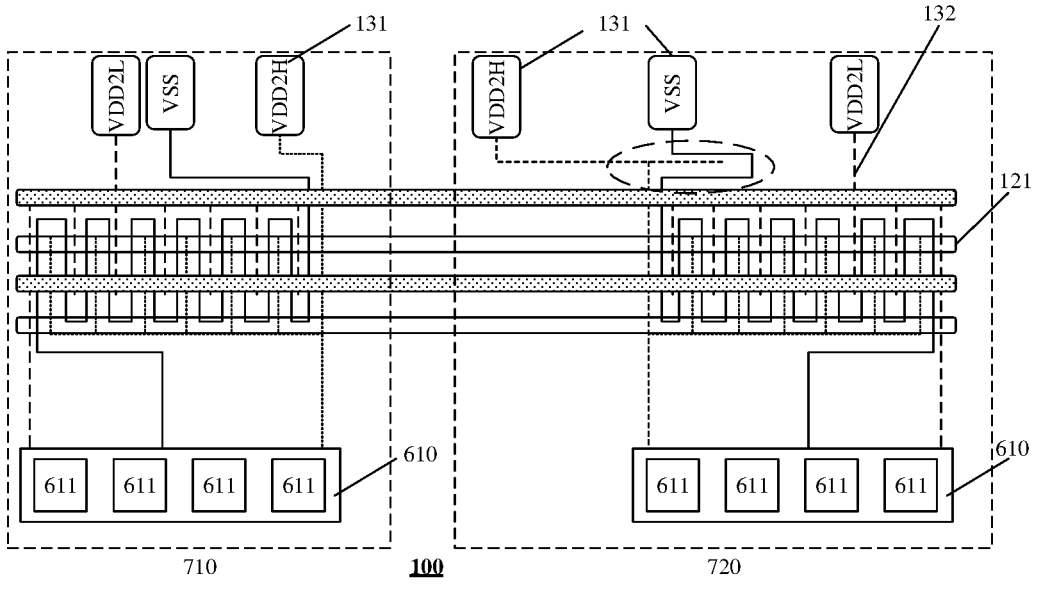
FIG. 7 is a schematic diagram of a semiconductor structure including different regions provided by an embodiment of the disclosure.

In some embodiments, as shown in FIG. 7, the semiconductor structure 100 further includes a first region 710 and a second region 720 disposed in parallel.

A redistribution layer 130 of the first region 710 and a redistribution layer 130 of the second region 720 each include a plurality of power pads 131. In the first region 710, the power pads 131 are connected with memory cell arrays 611 through electrical wires 132. In the second region 720, the power pads 131 are connected with memory cell arrays 611 through electrical wires 132.

In other embodiments, the above semiconductor structure 100 may also include more regions, each of which may have same structures such as power pads and electrical wires that are connected with different memory cell arrays, thereby facilitating expansion of the number of memory cell arrays.

Since the first region 710 and the second region 720 are arranged in parallel along the first direction, the above power conductive wires 121 extending along the first direction in the first conductive metal layer 120 may penetrate through the first region 710 and the second region 720 and be connected with the corresponding the high-speed circuit module 110.

In some embodiments, at least one of the power pads 131 in the first region 710 and at least one of the power pads 131 in the second region 720 provide a same power voltage.

Illustratively, the circuit structures and the structures such as the pads and the electrical wires in the first region 710 and the second region 720 may be the same. The circuit structures and the structures such as the pads and the electrical wires in the first region 710 and the second region 720 may have some differences, with some power pads of a same type for providing a same power voltage. As shown in FIG. 7, the first region 710 and the second region 720 each include a first power pad VDD2H, a second power pad VSS, and a third power pad VDD2L.

In some embodiments, a difference between resistance values of electrical wires with which a power pad in the first region and a power pad in the second region providing the same power voltage are respectively connected is less than a preset threshold.

Because the structures in the first region and second region may be different, extension routes of the electrical wires from the power pads of the same type to the corresponding memory cell arrays may also differ. That is to say, the structures such as the power pads and electrical wires in the first region and the second region are not completely symmetrical, which may lead to differences in power voltages supplied to the different memory cell arrays.

Therefore, in the embodiments of the disclosure, it is necessary to keep a less differences between the resistance values of the electrical wires with which the power pads for providing the same power voltage are connected with the different memory cell arrays in the first region and the second region. A threshold may be preset according to actual requirements. The difference between the resistance values of the two electrical wires needs to be less than the preset threshold.

Since the electrical wires are repeated bent in the first electrical wire regions of, total lengths of the electrical wires may be adjusted by designing bending routes. By doing so, a resistance value may be set, so that the resistance values of the two electrical wires are as equal as possible.

In some embodiments, the resistance values of the electrical wires with which the power pad in the first region and the power pad in the second region providing the same power voltage are respectively connected are same.

In some embodiments, a first electrical wire region of the electrical wires connected with the power pads of the first region is axisymmetrically distributed with a first electrical wire region of the electrical wires connected with the power pads of the second region.

That is, the electrical wires in the first electrical wire region of the first region and the corresponding electrical wires in the first electrical wire region of the second region are axisymmetrically distributed and have a same total length and a same resistance value. If a distribution of the power pads in the first region is not symmetrical with a distribution of the power pads in the second region, consistency of the resistance values of the electrical wires in the first region and second region may be achieved by adjusting lengths and shapes of the electrical wires outside the first electrical wire regions. As shown in FIG. 7, considering that the positions of the power pads in the first region 710 are not completely symmetrical with those in the second region 720, distances from the power pads 131 of the same type in the first region 710 and in the second region 720 to memory cell array regions 610 to be connected are different. Thus, the lengths and the routes of the electrical wires may be flexibly designed. For example, in FIG. 7, an extra extended part of the electrical wire with which the power pad VDD2H in the second region 720 is connected (indicated by a dotted circle in the figure) is used for keeping resistance consistency with the electrical wire with which the power pad VDD2H of the first region 710 is connected. Similarly, an extra bent part of the electrical wire with which the power pad VSS in the second region 720 is connected (indicated by the dotted circle in the figure) is also used for keeping resistance consistency with the electrical wire with which the power pad VSS is connected in the first region 710.

The embodiments of the disclosure also provide a memory, including a semiconductor structure as described in any of the above embodiments.

The memory may be of any type; and the distribution of its circuit structure and memory cell arrays may be in accordance with that described for the semiconductor structure.

Figure 8:
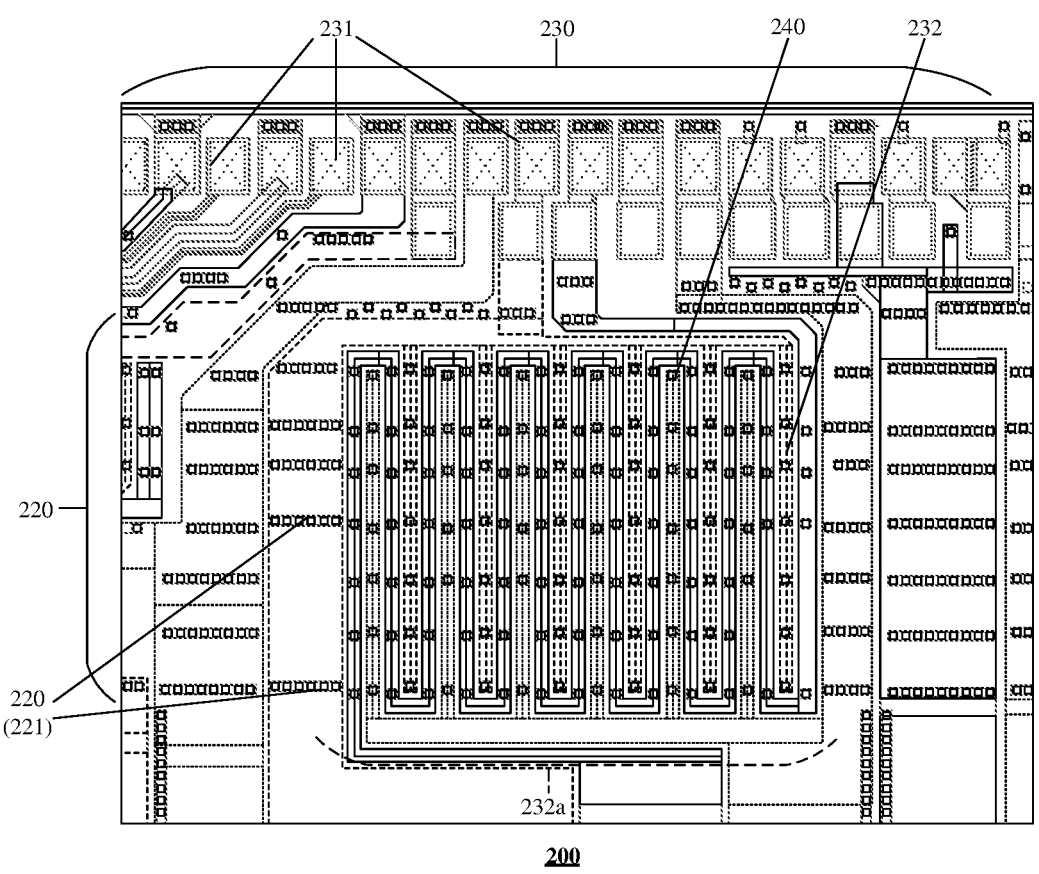
FIG. 8 is a schematic diagram of a layout structure provided by an embodiment of the disclosure.

As shown in FIG. 8, the embodiments of the disclosure also provide a layout structure 200, including a high-speed circuit module layout 210, a first conductive metal layer layout 220, and a redistribution layer layout 230.

The high-speed circuit module layout is at least used for forming a clock signal having a frequency greater than a first threshold.

The first conductive metal layer layout includes a plurality of power conductive wire patterns 221 extending along a first direction. The plurality of power conductive wire patterns are used for electrically connecting with the high-speed circuit module layout 210.

The redistribution layer layout is located above the first conductive metal layer layout 220 and includes a plurality of power pad patterns 231 and electrical wire patterns 232 connected with the power pad patterns 231. The power pad patterns 231 are located at one side of the high-speed circuit module layout 210. A projection of the power pad patterns 231 does not overlap with a projection of the high-speed circuit module layout 210. The electrical wire patterns 232 include a first electrical wire region 232a where the electrical wires are repeatedly bent. The first electrical wire region 232a at least partially covers the high-speed circuit module layout 210. The electrical wire patterns 232 are used for electrically connecting the power conductive wire patterns 221 and the power pad patterns 231.

The electrical wire patterns 232 in the above layout structure are repeatedly bent in the first electrical wire region 232a, and can have more overlaps with the first conductive metal layer layout 220, thereby facilitating setting more through via patterns 240 to represent connection relationships between the electrical wire patterns 232 and the power conductive wire patterns 221 in the first conductive metal layer layout 220.

In some embodiments, the plurality of power pad patterns at least include a first power pad pattern, a second power pad pattern, and a third power pad pattern arranged sequentially along a first direction. The first direction is an extension direction of the power conductive wire patterns.

An electrical wire pattern connected with the first power pad pattern is a first electrical wire pattern.

An electrical wire pattern connected with the second power pad pattern is a second electrical wire pattern.

An electrical wire pattern connected with the third power pad pattern is a third electrical wire pattern.

In some embodiments, first concave areas and second concave areas arranged alternately are formed along the first direction by bending the second electrical wire pattern in the first electrical wire region.

An orientation of notches of the first concave areas is opposite to an orientation of notches of the second concave areas.

The first electrical wire pattern includes a plurality of first branch patterns along the first direction. Each of the first branch patterns extends into a corresponding one of the first concave areas. The third electrical wire pattern includes a plurality of second branch patterns along the first direction. Each of the second branch patterns extends into a corresponding one of the second concave areas.

In some embodiments, the layout structure further includes a memory cell array region layout.

The memory cell array region layout is located at one side of the high-speed circuit module layout away from the power pad patterns. The memory cell array region layout includes a plurality of memory cell array patterns. The power pad patterns are connected with the memory cell array patterns through the electrical wire patterns of the redistribution layer layout.

It is to be understood that "an embodiment" or "some embodiments" referred to throughout the specification mean that particular features, structures or characteristics associated with the embodiment(s) are included in at least one embodiment of the disclosure. Therefore, the words "in an embodiment" or "in some embodiments" appearing throughout the specification do not necessarily refer to the same embodiment(s). In addition, these particular features, structures or characteristics may be incorporated in one or more embodiments in any suitable manner. It is to be understood that in the various embodiments of the disclosure, the size of the serial numbers of the above-mentioned processes does not mean the sequence of execution, and the execution sequence of each process should be determined by its function and inherent logic, and should not constitute any limitation on the implementation process of the embodiments of the disclosure. The above reference numerals of the embodiments in this disclosure are for description only, and do not represent the advantages and disadvantages of the embodiments.

It is to be noted that, in the disclosure, the terms "include", "comprise" or any other variation thereof are intended to encompass non-exclusive inclusion, so that a process, method, article or device that includes a set of elements includes not only those elements, but also other elements that are not explicitly listed, or also elements inherent to such a process, method, article or device. In the absence of further limitations, an element defined by the phrase "including . . . " does not exclude existence of another identical element in the process, method, article or device including the element.

Among the several embodiments provided in the disclosure, it should be understood that the disclosed apparatus and methods may be implemented in another manner. The embodiments of the device described above are only schematic. For example, the division of the unit is only a logical function division, and there may be another division mode in actual implementation, such as: multiple units or components can be combined, or integrated into another system, or some features can be ignored or not executed. In addition, coupling, or direct coupling, or communication connection between the various components shown or discussed may be indirect coupling or communication connection through some interfaces, devices or units, and may be electrical, mechanical, or of other form.

The units described above as separate elements may or may not be physically separated, and the elements displayed as elements may or may not be physical elements, i.e. may be located in one place or may be distributed over multiple network elements. According to the actual needs, some or all of the units can be selected to achieve the purpose of the solutions of the embodiments.

In addition, each functional unit in each embodiment of the disclosure may be all integrated into one processing unit, each unit may also be separately used as one unit, or two or more units may be integrated into one unit. The integrated unit may be realized either in a manner of hardware or in a manner of hardware plus software functional unit.

The above-mentioned are only some embodiments of the disclosure, and the protection scope of the disclosure is not limited thereto. Within the technical scope of the disclosure, any skilled person familiar with the technical field may easily conceive of changes or substitutions, which should be covered within the protection scope of the disclosure. Therefore, the scope of protection of this disclosure shall be subject to the scope of protection of the claims.

In the technical solutions of the embodiments of the disclosure, the plurality of power pads are located in the redistribution layer, and are connected with the first conductive metal layer through the electrical wires that are repeatedly bent in the first electrical wire region of the redistribution layer. The plurality of power pads are electrically connected with the high-speed circuit module. In this way, the contact area between the electrical wires and the high-speed circuit module can be effectively increased, so that a power source can directly supply power to the high-speed circuit, which is convenient for reducing power consumption. Moreover, the electrical wires in the redistribution layer can also extend and be connected with other circuit modules without affecting power supply to the high-speed circuit.

The invention claimed is:

1. A semiconductor structure comprising:
a high-speed circuit module comprising a clock signal with a frequency greater than a first threshold;
a first conductive metal layer comprising a plurality of power conductive wires extending along a first direction and arranged at intervals, the plurality of power conductive wires being electrically connected with the high-speed circuit module; and
a redistribution layer located above the first conductive metal layer and comprising a plurality of power pads and electrical wires connected with the plurality of power pads; wherein the plurality of power pads are located at one side of the high-speed circuit module, a projection of the plurality of power pads does not overlap with a projection of the high-speed circuit module, the electrical wires comprise a first electrical wire region where the electrical wires are repeatedly bent, the first electrical wire region at least partially covers the high-speed circuit module, and the electrical wires are used for electrically connecting the plurality of power conductive wires and the plurality of power pads.

2. The semiconductor structure of claim 1, wherein the plurality of power pads are used for providing different power voltages; and
wherein each of the plurality of power conductive wires comprises a plurality of power lines, the plurality of power lines are respectively used for connecting different power pads, and each of the plurality of power lines is electrically connected with an electrical wire of a corresponding power source through a plurality of connection vias.

3. The semiconductor structure of claim 2, wherein the electrical wires connected with the plurality of power pads are distributed at equal intervals in the first electrical wire region.

4. The semiconductor structure of claim 3, wherein the plurality of power pads at least comprise a first power pad, a second power pad, and a third power pad arranged sequentially along the first direction;
wherein an electrical wire connected with the first power pad is a first electrical wire;
wherein an electrical wire connected with the second power pad is a second electrical wire; and
wherein an electrical wire connected with the third power pad is a third electrical wire.

5. The semiconductor structure of claim 4, wherein first concave areas and second concave areas arranged alternately are formed along the first direction by bending the second electrical wire in the first electrical wire region;
wherein an orientation of notches of the first concave areas is opposite to an orientation of notches of the second concave areas; and
wherein the first electrical wire comprises a plurality of first branches along the first direction, and each of the plurality of first branches extends into a corresponding one of the first concave areas; the third electrical wire comprises a plurality of second branches along the first direction, and each of the plurality of second branches extends into a corresponding one of the second concave areas.

6. The semiconductor structure of claim 1, further comprising:
a memory cell array region located at one side of the high-speed circuit module away from the plurality of power pads, wherein the memory cell array region comprises a plurality of memory cell arrays, the plurality of power pads are connected with the plurality of memory cell arrays through the electrical wires of the redistribution layer.

7. The semiconductor structure of claim 6, wherein the electrical wires of the redistribution layer further comprise a second electrical wire region for connecting the plurality of memory cell arrays, a projection of the electrical wires in the second electrical wire region does not overlap the projection of the high-speed circuit module, and the electrical wires passing through the first electrical wire region and the second electrical wire region connect the plurality of power pads and the plurality of memory cell arrays.

8. The semiconductor structure of claim 6, further comprising:
a first region and a second region disposed in parallel;
wherein a redistribution layer of the first region and a redistribution layer of the second region each comprise a plurality of power pads, the plurality of power pads of the first region are connected with memory cell arrays of the first region through electrical wires of the first region, and the plurality of power pads of the second region are connected with memory cell arrays of the second region through electrical wires of the second region.

9. The semiconductor structure of claim 8, wherein at least one of the plurality of power pads of the first region and at least one of the plurality of power pads of the second region provide a same power voltage.

10. The semiconductor structure of claim 9, wherein a difference between resistance values of electrical wires with which a power pad of the first region and a power pad of the second region providing the same power voltage are connected is less than a preset threshold.

11. The semiconductor structure of claim 10, wherein the resistance values of the electrical wires with which the power pad of the first region and the power pad of the second region providing the same power voltage are connected are same.

12. The semiconductor structure of claim 8, wherein a first electrical wire region of the electrical wires connected with the plurality of power pads of the first region is axisymmetrically distributed with a first electrical wire region of the electrical wires connected with the plurality of power pads of the second region.

13. A layout structure, comprising:

a high-speed circuit module layout, the high-speed circuit module layout being at least used for forming a clock signal having a frequency greater than a first threshold;

a first conductive metal layer layout comprising a plurality of power conductive wire patterns extending along a first direction, the plurality of power conductive wire patterns being used for forming a plurality of power conductive wires to electrically connect with a high-speed circuit module; and a redistribution layer layout located above the first conductive metal layer layout, the redistribution layer layout comprising a plurality of power pad patterns and electrical wire patterns connected with the plurality of power pad patterns; wherein the plurality of power pad patterns are located at one side of the high-speed circuit module layout, a projection of the plurality of power pad patterns does not overlap with a projection of the high-speed circuit module layout, the electrical wire patterns comprise a first electrical wire region where the electrical wire patterns are repeatedly bent, the first electrical wire region at least partially covers the high-speed circuit module layout, and the electrical wire patterns electrically connect the plurality of power conductive wire patterns and the plurality of power pad patterns.

14. The layout structure of claim 13, wherein the plurality of power pad patterns at least comprise a first power pad pattern, a second power pad pattern, and a third power pad pattern arranged sequentially along the first direction;

wherein an electrical wire pattern connected with the first power pad pattern is a first electrical wire pattern;

wherein an electrical wire pattern connected with the second power pad pattern is a second electrical wire pattern; and wherein an electrical wire pattern connected with the third power pad pattern is a third electrical wire pattern.

15. The layout structure of claim 14, wherein first concave areas and second concave areas arranged alternately are formed along the first direction by bending the second electrical wire pattern in the first electrical wire region;

wherein an orientation of notches of the first concave areas is opposite to an orientation of notches of the second concave areas; and wherein the first electrical wire pattern comprises a plurality of first branch patterns along the first direction, and each of the plurality of first branch patterns extends into a corresponding one of the first concave areas; the third electrical wire pattern comprises a plurality of second branch patterns along the first direction, and each of the plurality of second branch patterns extends into a corresponding one of the second concave areas.

16. The layout structure of claim 13, further comprising:

a memory cell array region layout located at one side of the high-speed circuit module layout away from the plurality of power pad patterns, wherein the memory cell array region layout comprises a plurality of memory cell array patterns, and the plurality of power pad patterns are connected with the plurality of memory cell array patterns through the electrical wire patterns of the redistribution layer layout.

* * * * *